US012765224B2

United States Patent
(12) United States Patent
Shin et al.

(10) Patent No.: US 12,765,224 B2
(45) Date of Patent: Oct. 13, 2026

(54) DISPLAY DEVICE INCLUDING ELECTRODE INCLUDING GRAPHENE AND METAL LAYERS OF HEXAGONAL CLOSED PACKED STRUCTURE AND METHOD OF MANUFACTURING THE SAME

(71) Applicant: Samsung Display Co., LTD., Yongin-si (KR)

(72) Inventors: Hyuneok Shin, Yongin-si (KR); Taewook Kang, Yongin-si (KR); Sungjoo Kwon, Yongin-si (KR); Joonyong Park, Yongin-si (KR); Juhyun Lee, Yongin-si (KR); Changhee Lee, Yongin-si (KR); Samtae Jeong, Yongin-si (KR); Yung Bin Chung, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 381 days.

(21) Appl. No.: 18/229,225

(22) Filed: Aug. 2, 2023

(65) Prior Publication Data

US 2024/0074286 A1 Feb. 29, 2024

(30) Foreign Application Priority Data

Aug. 25, 2022 (KR) ........................ 10-2022-0107088

(51) Int. Cl.
*H10K 59/80* (2023.01)
*H10K 59/12* (2023.01)
(Continued)

(52) U.S. Cl.
CPC ... *H10K 59/80517* (2023.02); *H10K 59/1201* (2023.02); *H10K 59/1213* (2023.02);
(Continued)

(58) Field of Classification Search
CPC ......... H10K 59/80517; H10K 59/1213; H10K 59/122; H10K 2102/102; H10K 2102/103; H10K 59/805
See application file for complete search history.

(56) References Cited

U.S. PATENT DOCUMENTS

| | | | |
|---|---|---|---|
| 9,406,900 | B2 | 8/2016 | Yoon et al. |
| 9,640,332 | B2 | 5/2017 | Gardner et al. |

(Continued)

FOREIGN PATENT DOCUMENTS

| | | | |
|---|---|---|---|
| CN | 107275513 | A | 10/2017 |
| KR | 1020150112302 | A | 10/2015 |
| KR | 102126382 | B1 | 6/2020 |

OTHER PUBLICATIONS

Changyeong Jeong et al., Tackling light trapping in organic light-emitting diodes by complete elimination of waveguide modes, Jun. 25, 2021, Science Advances , pp. 1-17 (https://www.science.org/doi/10.1126/sciadv.abg0355).

*Primary Examiner* — Tracie Y Green
(74) *Attorney, Agent, or Firm* — CANTOR COLBURN LLP

(57) ABSTRACT

A display device includes a circuit layer and a display element layer on the circuit layer. The display element layer includes a light-emitting element and a pixel-defining film, through which a pixel opening is defined, and the light-emitting element includes a first electrode exposed through the pixel opening, a second electrode disposed opposite to the first electrode, and a light-emitting layer disposed between the first electrode and the second electrode. The first electrode includes a metal layer and a graphene layer disposed on an upper surface of the metal layer, and the metal layer and the graphene layer each have a hexagonal closed packed structure.

13 Claims, 10 Drawing Sheets

(51) Int. Cl.
*H10K 59/121* (2023.01)
*H10K 59/122* (2023.01)
*H10K 59/124* (2023.01)
*H10K 71/20* (2023.01)
*H10K 71/60* (2023.01)
*H10K 102/10* (2023.01)

(52) U.S. Cl.
CPC ......... *H10K 59/122* (2023.02); *H10K 59/124* (2023.02); *H10K 71/231* (2023.02); *H10K 71/60* (2023.02); *H10K 2102/102* (2023.02); *H10K 2102/103* (2023.02)

(56) References Cited

U.S. PATENT DOCUMENTS

| | | | | |
|---|---|---|---|---|
| 10,777,618 | B2 | 9/2020 | You et al. | |
| 2014/0332796 | A1 | 11/2014 | Zhou et al. | |
| 2015/0279498 | A1* | 10/2015 | Kim | C03C 17/3671<br>428/615 |
| 2016/0197304 | A1 | 7/2016 | Kang et al. | |
| 2022/0181569 | A1 | 6/2022 | Shida et al. | |
| 2024/0306419 | A1* | 9/2024 | Liu | H10K 50/816 |

* cited by examiner

DISPLAY DEVICE INCLUDING ELECTRODE INCLUDING GRAPHENE AND METAL LAYERS OF HEXAGONAL CLOSED PACKED STRUCTURE AND METHOD OF MANUFACTURING THE SAME

This application claims priority to Korean Patent Application No. 10-2022-0107088, filed on Aug. 25, 2022, and all the benefits accruing therefrom under 35 U.S.C. § 119, the content of which in its entirety is herein incorporated by reference.

BACKGROUND

1. Field

The disclosure herein relates to a display device including a graphene layer and a method of manufacturing the display device, the method including forming a graphene layer.

2. Description of the Related Art

In recent years, development of an organic electroluminescence display device, etc., as an image display device, has been actively carried out. An organic electroluminescent display device is a device including a so-called self-emission type light-emitting element that achieves a display by recombining, in an emitting layer, holes and electrons injected from a first electrode and a second electrode and causing light-emitting materials of the emitting layer to emit light.

SUMMARY

In an organic electroluminescent display device, a phenomenon that the light generated in a light-emitting element by causing light-emitting materials of an emitting layer to emit light is unable to be not emitted and is lost due to total internal reflection or the like may occur The disclosure provides a display device with improved luminous efficiency.

The disclosure also provides a method of manufacturing the display device with improved manufacturing efficiency.

An embodiment of the invention provides a display device including a circuit layer; a display element layer disposed on an upper surface of the circuit layer, where the display element layer includes a light-emitting element, and a pixel-defining film, through which a pixel opening is defined, where the light-emitting element includes a first electrode exposed through the pixel opening, a second electrode disposed opposite to the first electrode, and a light-emitting layer disposed between the first electrode and the second electrode, the first electrode includes a metal layer, and a graphene layer disposed on an upper surface of the metal layer, and each of the metal layer and the graphene layer has a hexagonal closed packed structure.

In an embodiment, the metal layer may include Zn or Tie.

In an embodiment, the metal layer may include a single metal.

In an embodiment, the metal layer may have a thickness of about 500 angstrom (Å) or greater.

In an embodiment, the first electrode further may include a metal oxide layer disposed below the metal layer, where the metal oxide layer may include a transparent conductive oxide.

In an embodiment, the transparent conductive oxide may include at least one selected from indium oxide (ITO), indium zinc oxide (IZO), indium gallium zinc oxide (IGZO), and zinc indium oxide (ZIO).

In an embodiment, the metal oxide layer may be thinner than the metal layer and thicker than the graphene layer.

In an embodiment, the circuit layer may include a transistor and an insulating layer disposed on an upper surface of the transistor, where the insulating layer may be a planarization layer and be in contact with the first electrode.

In an embodiment, the insulating layer may include at least one selected from photoresist polyimide (PSPI), siloxane, and an acrylic resin.

In an embodiment of the invention, a display device includes a circuit layer; and a display element layer disposed on an upper surface of the circuit layer, where the display element layer includes a light-emitting element, and a pixel-defining film, through which a pixel opening is defined, where the light-emitting element includes a first electrode exposed through the pixel opening, a second electrode disposed opposite to the first electrode, and a light-emitting layer disposed between the first electrode and the second electrode, and the first electrode includes a first layer including graphene, a second layer disposed below the first layer and including Zn or Ti, and a third layer disposed below the second layer and including a transparent conductive oxide.

In an embodiment, each of the first layer and the second layer may have a hexagonal closed packed structure.

In an embodiment, the transparent conductive oxide may include at least one selected from indium oxide (ITO), indium zinc oxide (IZO), indium gallium zinc oxide (IGZO), and zinc indium oxide (ZIO).

In an embodiment of the invention, a method of manufacturing a display device includes: preparing a circuit layer; forming a first electrode on an upper surface of the circuit layer; forming a light-emitting layer on an upper surface of the first electrode; and forming a second electrode on an upper surface of the light-emitting layer, where the forming of the first electrode includes forming a preliminary metal layer, forming a preliminary graphene layer on an upper surface of the preliminary metal layer at a room temperature and etching a preliminary first electrode including the preliminary metal layer and the preliminary graphene layer to form the first electrode, and each of the preliminary metal layer and the preliminary graphene layer has a hexagonal closed packed structure.

In an embodiment, the preliminary metal layer may include Zn or Ti.

In an embodiment, the preliminary graphene layer may be formed directly on an upper surface of the preliminary metal layer.

In an embodiment, the preliminary graphene layer may be provided through a plasma enhanced chemical vapor deposition (PECVD) method.

In an embodiment, in the etching the preliminary first electrode, the preliminary first electrode may be wet-etched with an etchant.

In an embodiment, the etchant may include at least one selected from phosphoric acid, acetic acid, and nitric acid.

In an embodiment, the forming the first electrode may further include, before the forming of the preliminary metal layer, forming a preliminary metal oxide layer, and the preliminary metal layer is formed on an upper surface of the preliminary metal oxide layer.

In an embodiment, in the etching the preliminary metal layer and the preliminary graphene layer, the preliminary metal oxide layer may be etched together with the preliminary metal layer and the preliminary graphene layer.

In an embodiment, the preliminary metal oxide layer may include a transparent conductive oxide.

In an embodiment, the transparent conductive oxide may include at least one selected from indium oxide (ITO), indium zinc oxide (IZO), indium gallium zinc oxide (IGZO), and zinc indium oxide (ZIO).

BRIEF DESCRIPTION OF THE DRAWINGS

The accompanying drawings are included to provide a further understanding of embodiments of the invention, and are incorporated in and constitute a part of this specification. The drawings illustrate embodiments of the invention and, together with the description, serve to explain principles of the invention. In the drawings.

DETAILED DESCRIPTION

Figure 1:
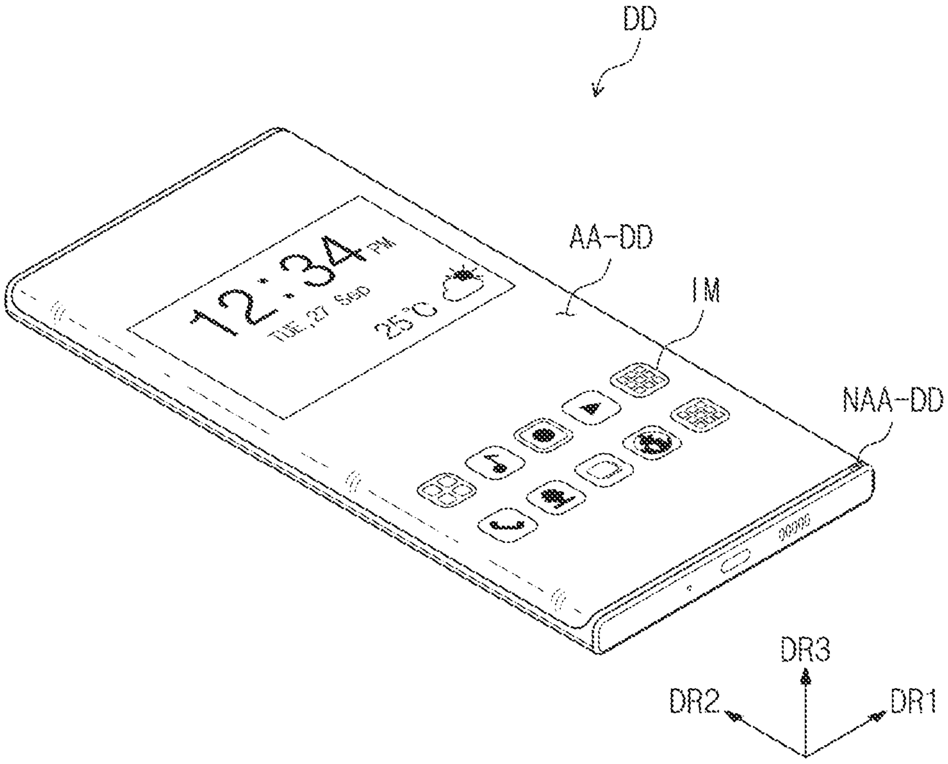
FIG. 1 is a perspective view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art.

In this specification, it will be understood that when an element (region, layer, or portion) is referred to as being "on", "connected to" or "coupled to" another element, it can be directly on, connected or coupled to the other element or intervening elements may be present.

Like numbers or symbols refer to like elements throughout. In the drawings, the thickness and the ratio and the dimension of the element are exaggerated for effective description of the technical contents. "Or" means "and/or." As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. For instance, a first element could be termed a second element and a second element could be termed a first element without departing from the teachings herein.

As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an.".

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

It will be further understood that the terms "comprises" and/or "comprising," or "includes" and/or "including", when used in this specification, specify the presence of stated features, integers, steps, operations, elements, and/or components, but do not preclude the presence or addition of one or more other features, integers, steps, operations, elements, components, and/or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. Further, it will be understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

Figure 2:
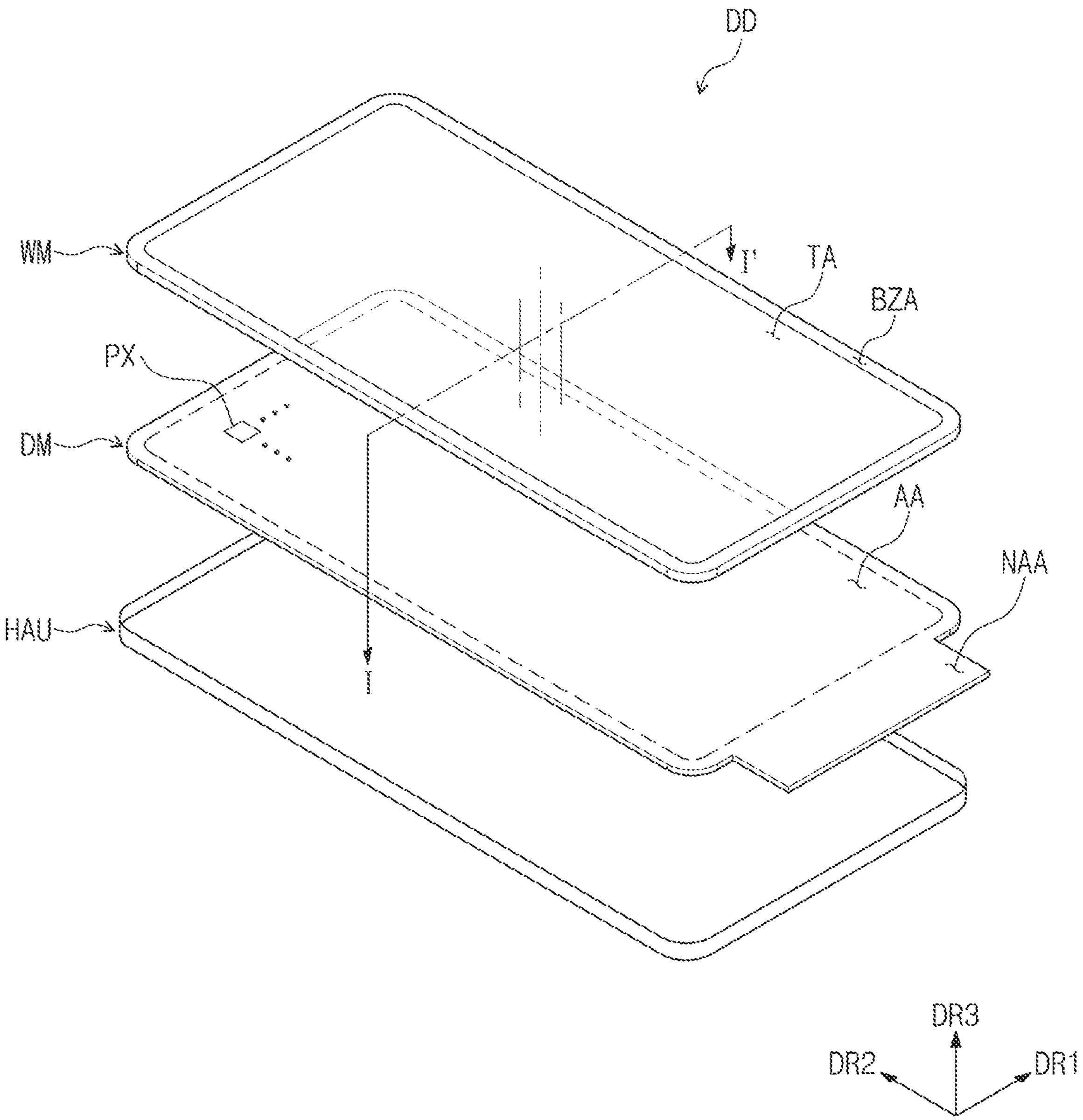
FIG. 2 is an exploded perspective view illustrating a display device according to an embodiment.
Figure 3:
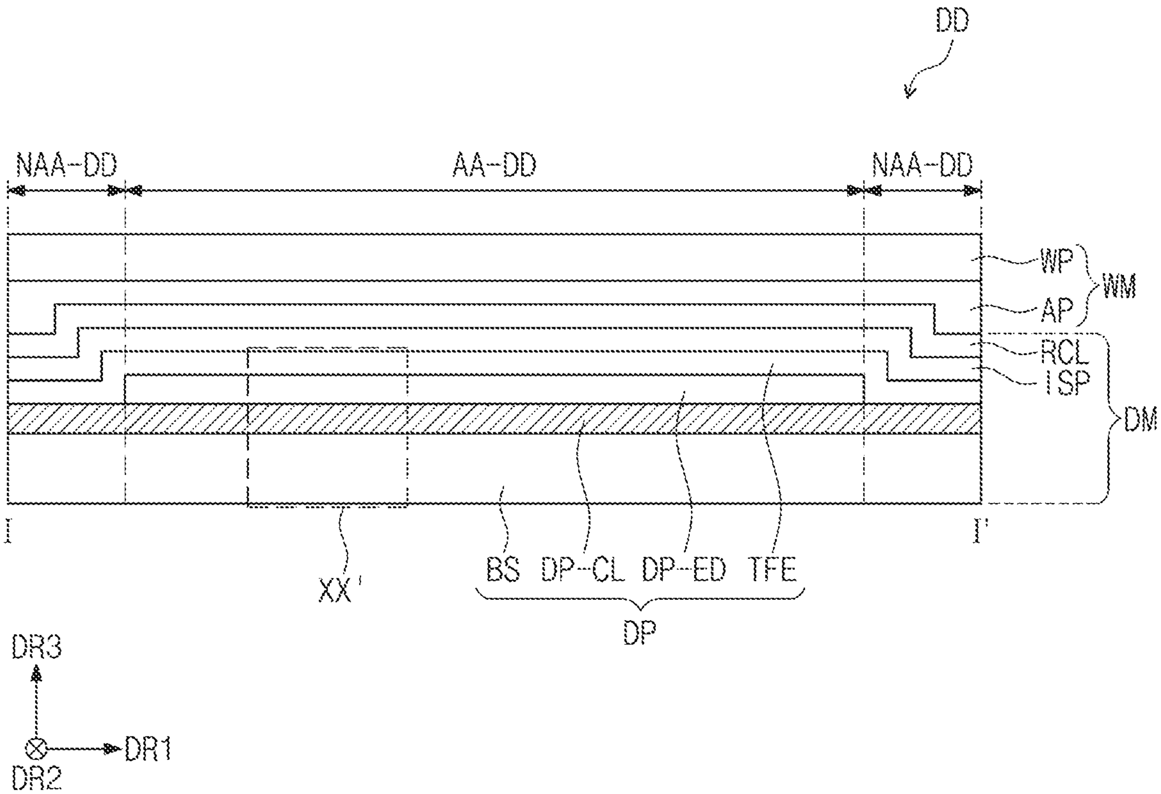
FIG. 3 is a cross-sectional view illustrating a portion corresponding to line I-I' of FIG. 2.

FIG. 1 is a perspective view illustrating a display device DD according to an embodiment. FIG. 2 is an exploded perspective view illustrating a display device DD according to an embodiment. FIG. 3 is a cross-sectional view illustrating a portion corresponding to line I-I' of FIG. 2. Also, FIG. 3 may be a cross-sectional view illustrating a display device DD according to an embodiment.

The display device DD according to an embodiment may be activated in response to an electrical signal. In an embodiment, for example, the display device DD may be a mobile phone, a tablet personal computer (PC), a vehicle navigation unit, a game console, or a wearable device, but an embodiment is not limited thereto. In FIG. 1, an embodiment where the display device DD is a mobile phone is exemplarily illustrated.

The display device DD may display an image IM through an active area AA-DD. The active area AA-DD may include a planar surface defined by a first direction axis DR1 and a second direction axis DR2. The active area AA-DD may further include a curved surface bent from at least one side of the plane defined by the first direction axis DR1 and the second direction axis DR2. FIG. 1 illustrates an embodiment where the display device DD includes two curved surfaces respectively bent from both sides of the plane defined by the first direction axis DR1 and the second direction axis DR2. However, this is illustrated as an example, and the shape of the active area AA-DD is not limited thereto. In an alternative embodiment, for example, the active area AA-DD may include only a flat or planar surface, or may further include four curved surfaces respectively bent from at least two or more sides, for example, four sides of the flat or planar surface.

A peripheral area NAA-DD is adjacent to the active area AA-DD. The peripheral area NAA-DD may surround the active area AA-DD. Accordingly, the shape of the active area AA-DD may be substantially defined by the peripheral area NAA-DD. However, this is illustrated as an example, and alternatively, the peripheral area NAA-DD may be disposed adjacent to only one side of the active area AA-DD, or may be omitted. The display device DD according to an embodiment may include various shapes of active areas, and is not limited to any one embodiment.

In FIG. 1 and the following drawings, the first direction axis DR1 to a third direction axis DR3 are illustrated and the directions indicated by the first to the third direction axes DR1, DR2, and DR3 described herein have relative concepts, and thus may be changed to other directions. Also, directions indicated by the first to third direction axes DR1, DR2, and DR3 may be described as the first to third directions, and the same reference numerals or symbols may be used. In this specification, the first direction axis DR1 and the second direction axis DR2 may be orthogonal to each other, and the third direction axis DR3 may be a normal direction of a plane defined by the first direction axis DR1 and the second direction axis DR2.

The thickness direction of the display device DD may be parallel to the third direction axis DR3 which is the normal direction of the plane defined by the first direction axis DR1 and the second direction axis DR2. In this specification, a front surface (or upper surface) and a rear surface (or lower surface) of each member which constitutes the display device DD may be defined on the basis of the third direction axis DR3. In this specification, an upper side/surface and a lower side/surface may be defined based on the third direction axis DR3. The upper side indicates a direction adjacent to the active area AA-DD in which the image IM is displayed, the upper side indicates a surface facing the upper side, the lower side indicates a direction away from the active area AA-DD in which the image IM is displayed, and the lower side indicates a surface facing the lower side.

Referring to FIGS. 2 and 3, the display device DD according to an embodiment may include a housing HAU, a display module DM, and a window member WM. The housing HAU may accommodate the display module DM or like.

The window member WM may cover an entire outer side of the display module DM. The window member WM may include a transmission area TA and a bezel area BZA. The front surface of the window member WM including the transmission area TA and the bezel area BZA may correspond to the front surface of the display device DD. The transmission area TA may correspond to the active area AA-DD of the display device DD illustrated in FIG. 1, and the bezel area BZA may correspond to the peripheral area NAA-DD of the display device DD illustrated in FIG. 1.

The transmission area TA may be optically transparent. The bezel area BZA may have relatively low light transmittance compared to the transmission area TA. The bezel area BZA may have a predetermined color. The bezel area BZA may be adjacent to the transmission area TA, and surround the transmission area TA. The shape of the transmission area TA may be defined by the bezel area BZA. However, an embodiment is not limited thereto, and alternatively, the bezel area BZA may be disposed adjacent to only one side of the transmission area TA and may be partially omitted.

In an embodiment, the window member WM may further include at least one functional layer (not illustrated) provided on an upper side of the window WP. In an embodiment, for example, the functional layer (not illustrated) may be a hard coating layer, an anti-fingerprint coating layer, or the like, but an embodiment is not limited thereto.

The window WP may include an optically transparent insulating material. The window WP may be a glass substrate or a polymer substrate. In an embodiment, for example, the window WP may include a tempered glass substrate that has been subjected to reinforcement treatment. Alternatively, the window WP may be made of polyimide, polyacrylate, polymethylmethacrylate, polycarbonate, polyethylenenaphthalate, polyvinylidene chloride, polyvinylidene difluoride, polystyrene, an ethylene vinylalcohol copolymer or a combination thereof. However, the materials described above are listed as an example, and the material included in the window WP is not limited thereto.

The display module DM may be bonded to the window WP through an adhesive layer AP. The adhesive layer AP may include a typical adhesive such as a pressure sensitive adhesive (PSA), an optically clear adhesive (OCA) or an optical clear resin (OCR), and the like, but is not limited to any one embodiment. In an alternative embodiment of the invention, the adhesive layer AP may be omitted.

The display module DM may be configured to generate an image and detect an input applied from the outside. The display module DM may include a display panel DP and an input sensor ISP disposed on an upper side of the display panel DP. In addition, the display module DM may further include an optical layer RCL disposed on an upper side of the input sensor ISP.

In an embodiment, an active area AA and a peripheral area NAA are defined in the display module DM. The active area AA may be activated in response to an electrical signal. The peripheral area NAA may be located adjacent to at least one side of the active areas AA.

The active area AA of the display module DM may correspond to the active area AA-DD of the display device DD illustrated in FIG. 1. The peripheral area NAA of the display module DM may be disposed to surround the active area AA of the display module DM. However, an embodiment is not limited thereto, and alternatively, a portion of the peripheral area NAA may be omitted. A driving circuit, driving wiring or the like for driving the active area AA may be disposed in the peripheral area NAA.

A plurality of pixels PX may be disposed in the active area AA of the display module DM. The plurality of pixels PX may include red, green, and blue pixels, and may further include a white pixel according to an embodiment.

The optical layer RCL may be disposed on an upper side of the input sensor ISP. The optical layer RCL may be an anti-reflection layer that reduces the reflectance of external incident light from the outside of the display module DM. The optical layer RCL may be formed on the upper side of the input sensor ISP through a continuous process. The optical layer RCL may include a polarizing plate or a color filter layer. In an embodiment where the optical layer RCL includes a color filter layer, the color filter layer may include a plurality of color filters having a predetermined arrangement. In an embodiment, for example, the arrangement of the color filters may be determined in consideration of emission colors of pixels included in the display panel DP. Additionally, the optical layer RCL may further include a black matrix adjacent to the color filters. In an alternative embodiment of the invention, the optical layer RCL may be omitted.

The input sensor ISP may be disposed on the upper side of the display panel DP. The input sensor ISP may detect an external input applied from the outside. The external input may be a user's input. The user's input may include various types of external inputs such as a part of a user's body, light, heat, pen, pressure or like.

In an embodiment, the input sensor ISP may be formed on the upper side of the display panel DP through a continuous process. In such an embodiment, the input sensor ISP may be directly disposed on the upper side of the display panel DP. Herein, the expression, being "directly disposed", may mean that there are no intervening components disposed between the input sensor ISP and the display panel DP. That is, an adhesive member may not be additionally disposed between the input sensor ISP and the display panel DP. Alternatively, the input sensor ISP and the display panel DP may be bonded to each other through an adhesive member. The adhesive member may include a typical bonding agent or adhesive agent.

In this specification, the expression, one component being "directly disposed/directly provided" on another component, means that another component does not exist between the one component and the other component. That is, the wording, one component being "directly disposed/directly provided" on another component, means that the one component and the other component are in "contact" with each other.

The display panel DP may be configured to substantially generate an image. The display panel DP may be a light-emitting display panel. In an embodiment, for example, the display panel DP may be an organic light-emitting display panel, an inorganic light-emitting display panel, a quantum dot display panel, a micro light emitting diode (LED) display panel, or a nano LED display panel. The display panel DP may also be referred to as a display layer. The display panel DP may include a base layer BS, a circuit layer DP-CL, a display element layer DP-ED, and an encapsulation layer TFE.

The base layer BS may be a member for providing a base surface on which the circuit layer DP-CL is disposed. The base layer BS may be a rigid substrate or a flexible substrate capable of bending, folding, or rolling. The base layer BS may be a glass substrate, a metal substrate, or a polymer substrate. However, an embodiment of the invention is not limited thereto, and alternatively the base layer BS may be an inorganic layer, an organic layer, or a composite material layer.

The circuit layer DP-CL may be disposed on an upper surface of the base layer BS. The circuit layer DP-CL may include an insulating layer, a semiconductor pattern, a conductive pattern, and a signal line or the like. In an embodiment, after an insulating layer, a semiconductor layer, and a conductive layer are formed on an upper surface of the base layer BS through coating, deposition, etc., the insulating layer, the semiconductor layer, and the conductive layer may be selectively patterned by performing a photolithography process multiple or several times. Thereafter, the semiconductor pattern, the conductive pattern, and the signal line included in the circuit layer DP-CL may be formed.

The display element layer DP-ED may be disposed on an upper surface of the circuit layer DP-CL. The display element layer DP-ED may include the light-emitting element ED (see FIG. 4) to be described later. In an embodiment, for example, the display element layer DP-ED may include an organic light-emitting material, an inorganic light-emitting material, an organic-inorganic light-emitting material, quantum dots, quantum rods, a micro LED, or a nano LED.

An encapsulation layer TFE may be disposed on an upper surface of the display element layer DP-ED. The encapsulation layer TFE may protect the display element layer DP-ED against foreign substances such as moisture, oxygen, and dust particles. The encapsulation layer TFE may include at least one insulating layer.

Figure 4:
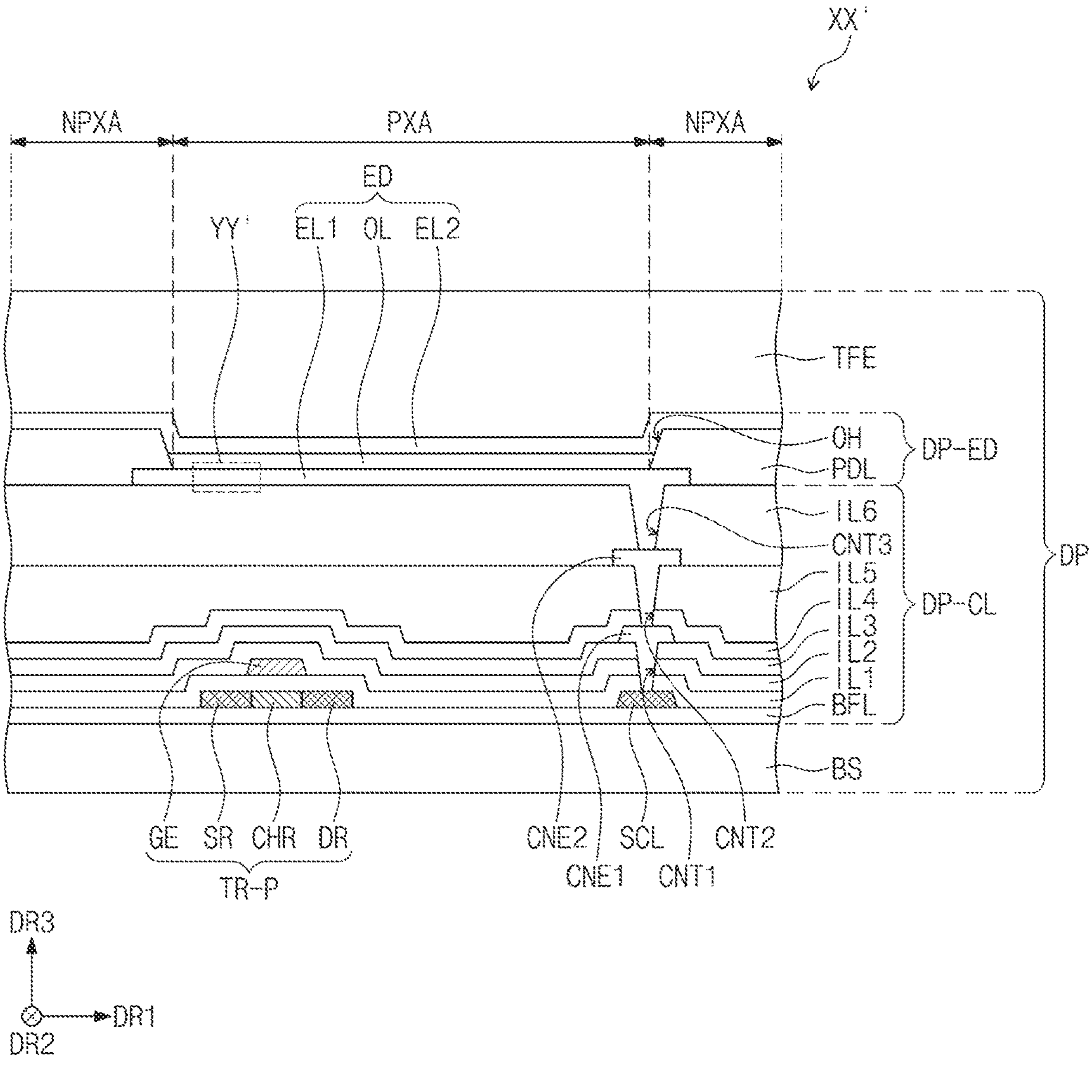
FIG. 4 is an enlarged cross-sectional view illustrating a region XX' of FIG. 3.

FIG. 4 is an enlarged cross-sectional view illustrating a region XX' of FIG. 3. FIG. 4 is an enlarged cross-sectional view of a display panel DP of FIG. 3. Referring to FIG. 4, an embodiment of the display panel DP may include the base layer BS, the circuit layer DP-CL, the display element layer DP-ED, and the encapsulation layer TFE which are sequentially stacked.

The base layer BS may have a single- or multi-layered structure. In an embodiment, for example, the base layer BS may include a first synthetic resin layer, a single- or multi-layered intermediate layer, and a second synthetic resin layer which are sequentially stacked. The intermediate layer may be referred to as a base barrier layer. The intermediate layer may include a silicon oxide (SiOx) layer and an amorphous silicon (a-Si) layer disposed on an upper surface of the silicon oxide layer, but is not particularly limited thereto. In an embodiment, for example, the intermediate layer may include at least one selected from a silicon oxide layer, a silicon nitride layer, a silicon oxynitride layer, and an amorphous silicon layer.

The first and second synthetic resin layers may each include a polyimide-based resin. The first and second synthetic resin layers may each include at least one selected from an acrylate-based resin, a methacrylate-based resin, a polyisoprene-based resin, a vinyl-based resin, an epoxy-based resin, a urethane-based resin, a cellulose-based resin, a siloxane-based resin, a polyamide-based resin, and a perylene-based resin. In this specification, a "~-based" resin may be considered as a resin containing a functional group of "~".

At least one inorganic layer may be disposed or formed on an upper surface of the base layer BS. FIG. 4 illustrates an embodiment where a buffer layer BFL is disposed on the upper surface of the base layer BS. The buffer layer BFL may improve the bonding strength between the base layer BS and the semiconductor pattern. The buffer layer BFL may include a silicon oxide layer and a silicon nitride layer, and the silicon oxide layer and the silicon nitride layer may be alternately stacked one on another.

The semiconductor pattern may be disposed on an upper surface of the buffer layer BFL. In an embodiment, the semiconductor pattern may include polysilicon. However, an embodiment of the invention is not limited thereto, and alternatively, the semiconductor pattern may include an amorphous silicon or a metal oxide.

FIG. 4 illustrates a portion of semiconductor pattern, and the semiconductor pattern may be further disposed in another region. The semiconductor pattern may be arranged across the pixels PX (see FIG. 2) in accordance with a specific rule or arrangement. The semiconductor pattern may have electrical properties varying depending on whether to be doped or not. The semiconductor pattern may include a first region having high conductivity and a second region having low conductivity. The first region may be doped with an N-type dopant or a P-type dopant. A P-type transistor may include a doped region doped with a P-type dopant. The second region may be an undoped region or may be doped with a dopant having a lower concentration than the first region.

The first region may have a higher conductivity than the second region, and substantially serve as an electrode or a signal line. The second region may substantially correspond to an active region (or channel region) of a pixel transistor TR-P. In other words, a portion of the semiconductor pattern may be an active region of a transistor, and another portion may be a source region or a drain region of the transistor.

FIG. 4 exemplarily illustrates one pixel transistor TR-P and one light-emitting element ED of the pixel PX (see FIG. 2). A source region SR, a channel region CHR, and a drain region DR of the pixel transistor TR-P may be formed from the semiconductor pattern. The source region SR and the drain region DR may extend in opposite directions from the channel region CHR on a cross section defined by the first direction axis DR1 and the third direction axis DR3. FIG. 4 illustrates a portion of a signal transmission region SCL formed as (or defined by) a first region (or portion) of the semiconductor pattern. Although not illustrated separately in the figures, the signal transmission region SCL may be connected to the pixel transistor TR-P on the plane defined by the first direction axis DR1 and the second direction axis DR2.

A first insulating layer IL1 may be disposed on the upper surface of the buffer layer BFL. The first insulating layer IL1 may overlap the plurality of pixels PX (see FIG. 2) in common, and cover the semiconductor pattern. The first insulating layer IL1 may be an inorganic layer and/or an organic layer, and may have a single- or multi-layer structure. The first insulating layer IL1 may include at least one selected from aluminum oxide, titanium oxide, silicon oxide, silicon nitride, silicon oxynitride, zirconium oxide, and hafnium oxide. In an embodiment, for example, the first insulating layer IL1 may be a single-layered silicon oxide layer. Not only the first insulating layer IL1 but also an insulating layer of the circuit layer DP-CL to be described later may be an inorganic layer and/or an organic layer, and may have a single- or multi-layer structure. The inorganic layer may include at least one selected from the materials listed above for the first insulating layer IL1, but is not limited thereto.

A gate GE of the pixel transistor TR-P may be disposed on an upper surface of the first insulating layer IL1. The gate GE may be a portion of a metal pattern. The gate GE may overlap the channel region CHR. In a process of doping the semiconductor pattern, the gate GE may function as a mask.

A second insulating layer IL2 may be disposed on the upper surface of the first insulating layer IL1, and may cover the gate GE. The second insulating layer IL2 may overlap the pixels PX (see FIG. 2) in common. The second insulating layer IL2 may be an inorganic layer and/or an organic layer, and may have a single- or multi-layer structure. In an embodiment, for example, the second insulating layer IL2 may be a single-layered silicon oxide layer.

A third insulating layer IL3 may be disposed on an upper surface of the second insulating layer IL2. In an embodiment, for example, the third insulating layer IL3 may be a single-layered silicon oxide layer. A first connection electrode CNE1 may be disposed on an upper surface of the third insulating layer IL3. The first connection electrode CNE1 may be connected to the signal transmission region SCL through a first contact hole CNT1 defined through the first to third the insulating layers IL1, IL2, and IL3.

A fourth insulating layer IL4 may be disposed on the upper surface of the third insulating layer IL3. In an embodiment, for example, the fourth insulating layer IL4 may be a single-layered silicon oxide layer. A fifth insulating layer IL5 may be disposed on an upper surface of the fourth insulating layer IL4. The fifth insulating layer IL5 may be an organic layer.

A second connection electrode CNE2 may be disposed on an upper surface of the fifth insulating layer IL5. The second connection electrode CNE2 may be connected to the first connection electrode CNE1 through a second contact hole CNT2 defined through the fourth insulating layer IL4 and the fifth insulating layer IL5.

A sixth insulating layer IL6 may be disposed on the upper surface of the fifth insulating layer IL5. The sixth insulating layer IL6 may cover the second connection electrode CNE2. The sixth insulating layer IL6 may be a planarization layer. The sixth insulating layer IL6 may include at least one selected from photoresist polyimide (PSPI), a siloxane-based resin, and an acryl-based resin. In an embodiment, for example, the sixth insulating layer IL6 may include the photoresist polyimide (PSPI). A material included in the sixth insulating layer IL6 may contain a plurality of carboxyl groups.

A display element layer DP-ED may be disposed on an upper surface of the sixth insulating layer IL6. The display element layer DP-ED may include a pixel-defining film PDL and the light-emitting element ED. A pixel opening OH may be defined in the pixel-defining film PDL. The pixel-defining film PDL may include an organic light-blocking material or an inorganic light-blocking material which includes a black pigment and a black dye.

The light-emitting element ED may include a first electrode EL1 disposed on the upper surface of the sixth insulating layer IL6, a second electrode EL2 disposed opposite to or facing the first electrode EL1, and a light-emitting layer OL disposed between the first electrode EL1 and the second electrode EL2. The first electrode EL1 may be connected to the second connection electrode CNE2 through a third contact hole CNT3 defined through the sixth insulating layer IL6. The first electrode EL1 may be in contact with the sixth insulating layer IL6.

In an embodiment, the first electrode EL1 may be an anode. The first electrode EL1 may include a graphene layer GL (see FIG. 5). The first electrode EL1 will be described later in detail with reference to FIG. 5.

The light-emitting layer OL may be disposed to correspond to the pixel opening OH. That is, the light-emitting layer OL may be separately formed in each of the pixels PX (see FIG. 2). In an embodiment where the light-emitting layer OL is separately formed in each of the pixels PX (see FIG. 2), the separated light-emitting layers OL may each emit at least one of blue, red, or green light. However, an embodiment of the invention is not limited thereto, and the light-emitting layer OL may be formed as a common layer to overlap the pixels PX (see FIG. 2). In an embodiment where the light-emitting layer OL is formed as a common layer, the light-emitting layer OL may emit blue light or white light.

The second electrode EL2 may be a cathode. The second electrode EL2 may be disposed as a common layer to overlap the pixels PX (see FIG. 2). The second electrode EL2 may be referred to as a common electrode. A common voltage may be applied to the second electrode EL2. The second electrode EL2 may include: at least one selected from Ag, Mg, Cu, Al, Pt, Pd, Au, Ni, Nd, Ir, Cr, Li, Ca, LiF, Mo, Ti, W, In, Sn, and Zn; a compound of two or more selected therefrom; a mixture of two or more selected therefrom; or an oxide thereof.

The pixel opening OH may expose at least a portion of the first electrode EL1. An emission area PXA may be defined corresponding to a portion of the first electrode EL1 exposed by the pixel opening OH. The non-emission area NPXA may correspond to the pixel-defining film PDL. The non-emission area NPXA may surround the emission area PXA.

Although not illustrated, the light-emitting element ED may include a hole transport region disposed between the first electrode EL1 and the light-emitting layer OL and an electron transport region disposed between the second electrode EL2 and the light-emitting layer OL. The hole transport region may include at least one selected from a hole injection layer, a hole transport layer, and an electron blocking layer. The electron transport region may include at least one selected from an electron injection layer, an electron transport layer, and a hole blocking layer.

The encapsulation layer TFE may include at least one inorganic film (hereinafter, inorganic encapsulation film). The encapsulation layer TFE may include at least one organic film (hereinafter, organic encapsulation film) and at least one inorganic encapsulation film.

The inorganic encapsulation film may protect the display element layer DP-ED against moisture/oxygen, and the encapsulation organic film may protect the display element layer DP-ED against foreign substances such as dust. The inorganic encapsulation film may include silicon nitride, silicon oxy nitride, silicon oxide, titanium oxide, aluminum oxide, or the like, but is not particularly limited thereto. The encapsulation organic film may include an acryl-based compound, an epoxy-based compound, or the like. The encapsulation organic film may include a photopolymerizable organic material, but is not particularly limited thereto.

Figure 5:
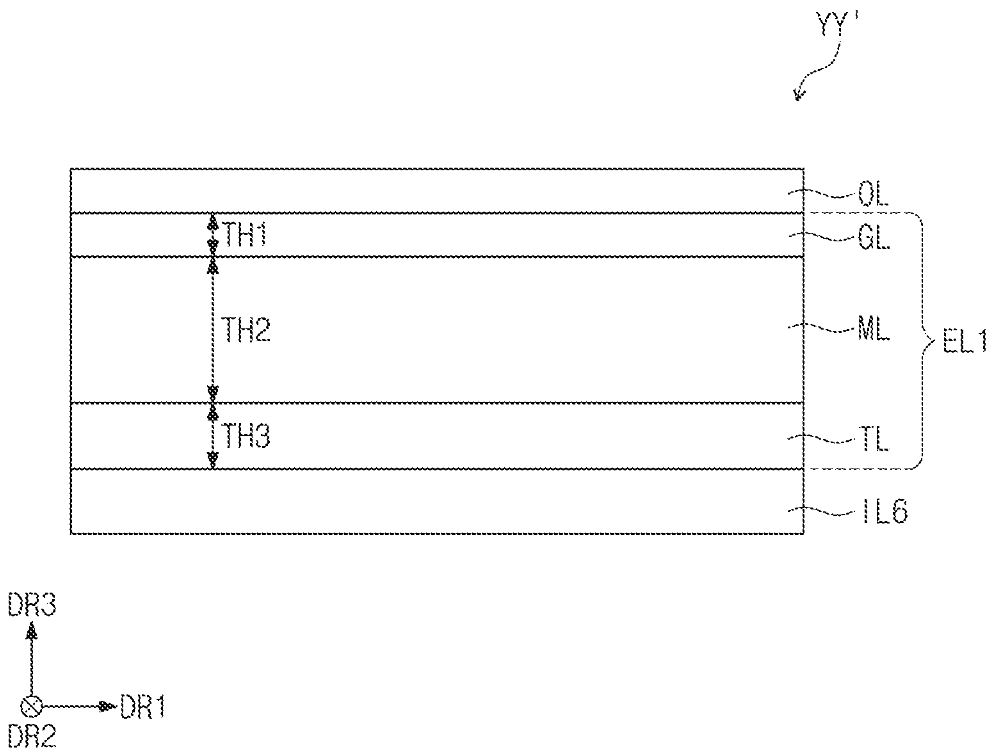
FIG. 5 is an enlarged cross-sectional view illustrating a region YY' of FIG. 4.

FIG. 5 is an enlarged cross-sectional view illustrating a region YY' of FIG. 4. FIG. 5 may include an enlarged cross-section of a first electrode EL1.

In an embodiment, the first electrode EL1 may include a metal layer ML and a graphene layer GL disposed on an upper surface of the metal layer ML. The graphene layer GL and the metal layer ML may have a same crystal structure as each other. In an embodiment, the graphene layer GL and the metal layer ML may each have a hexagonal closed packed structure.

The graphene layer GL may include graphene, and be formed to have a very small thickness. The graphene may have a hexagonal closed packed structure (or a hexagonal close-packed structure). In an embodiment, for example, the graphene layer GL may have a thickness of about 10 angstrom (Å) or less. The work function of the first electrode EL1 including the graphene layer GL may be about 4.6 electronvolts (eV). Accordingly, the graphene layer GL may easily inject holes into the light-emitting layer OL. In the light-emitting layer OL, holes and electrons may combine to emit light.

The graphene layer GL may have a very small thickness, and thus light loss caused by total reflection may be alleviated. A refractive index of a medium through which light passes may be defined as a value obtained by multiplying a refractive index (n) of a material included in the medium and a thickness (d) of the medium, and as the thickness of the material becomes smaller, the refractive index of the medium is lower. In an embodiment, since the graphene layer GL has a very small thickness, total reflection resulted from a refractive index difference between the graphene layer GL and a component (for example, light-emitting layer) adjacent thereto may be minimized or effectively prevented. Accordingly, in such an embodiment, light loss caused by total reflection is minimized or prevented, so that the light-emitting element ED including the graphene layer GL may have improved luminous efficiency. The display device DD including the light-emitting element ED including the graphene layer GL may exhibit high luminous efficiency.

In such an embodiment, since the metal layer ML and the graphene layer GL have the same crystal structure as each other, the graphene layer GL may be formed easily. The material used to form the graphene layer GL may be provided directly on the upper surface of the metal layer ML. The graphene layer GL may be formed at a room temperature. In the method of manufacturing the display device, according to an embodiment, to be described later, the forming of the graphene layer GL will be described in detail.

In an embodiment, the metal layer ML may include a single metal. The metal layer ML does not include an alloy and a metal oxide. The metal layer ML may include only a metal and the metal may be a single metal. The single metal may have the same crystal structure as that of graphene included in the graphene layer GL. In such an embodiment, since the metal layer ML includes the single metal having the same crystal structure as that of the graphene, the graphene layer GL may be formed easily on the metal layer ML.

In an embodiment, the metal layer ML may include Zn or Ti (e.g., one selected from Zn and Ti. In an embodiment, the metal layer ML includes Zn and the crystal structure of Zn may be a hexagonal closed packed structure. Alternatively, the metal layer ML may include Ti and the crystal structure of Ti may be a hexagonal closed packed structure.

The metal layer ML may have a thickness TH2 of about 500 Å or greater. The metal layer ML having the thickness TH2 of 500 Å or greater may exhibit high reflectivity. When light emitted from the light-emitting layer OL propagates downwards, the light may be reflected on the metal layer ML and propagates upwards. Accordingly, the light-emitting element ED including the metal layer ML having the thickness TH2 of about 500 Å or greater may have improved luminous efficiency. The display device DD including the light-emitting element ED including the metal layer ML may exhibit high luminous efficiency.

In an embodiment, the first electrode EL1 may further include a metal oxide layer TL disposed under the metal layer ML. The metal oxide layer TL may include a transparent conductive oxide. The transparent conductive oxide may include at least one selected from indium oxide (ITO), indium zinc oxide (IZO), indium gallium zinc oxide (IGZO), and zinc indium oxide (ZIO). However, this is described as an example, and a material, which has been known as a transparent conductive oxide in the relevant art may be used for the metal oxide layer TL according to an embodiment without any limitation.

The metal oxide layer TL including the transparent conductive oxide may enhance an adhesive force to the sixth insulating layer IL6. As described above, the sixth insulating layer IL6 may contain a plurality of carboxyl groups. The plurality of carboxyl groups may exhibit high bonding strength to the conductive metal oxide included in the metal oxide layer TL. Accordingly, the display device DD including the metal oxide layer TL, which is disposed directly on an upper surface of the sixth insulating layer IL6 and includes the transparent conductive oxide, may exhibit high reliability.

A thickness TH3 of the metal oxide layer TL may be smaller than the thickness TH2 of the metal layer ML and greater than the thickness TH1 of the graphene layer GL. In an embodiment, for example, the thickness TH3 of the metal oxide layer TL may be in a range of about 50 Å to about 70 Å. However, this is described as an example, and the range of the thickness TH3 of the metal oxide layer TL is not limited thereto.

In an embodiment, the first electrode EL1 may include a first layer GL containing (or defined by) a graphene layer, a second layer ML including Zn or Ti, and a third layer TL including a transparent conductive oxide. The transparent conductive oxide may include at least one selected from indium oxide (ITO), indium zinc oxide (IZO), indium gallium zinc oxide (IGZO), and zinc indium oxide (ZIO). The second layer ML may be disposed below the first layer GL, and the third layer TL may be disposed below the second layer ML. In this specification, the graphene layer GL is the same as the first layer, the metal layer ML is the same as the second layer, and the metal oxide layer TL is the same as the third layer. The descriptions of the graphene layer GL, the metal layer ML, and the metal oxide layer TL may be similarly applied to the first to third layers.

The first layer GL and the second layer ML may have a same crystal structure as each other. In an embodiment, a crystal structure of graphene contained in the first layer GL may be the same as a crystal structure of Zn or Ti contained in the second layer ML. The first layer GL and the second layer ML may each have a hexagonal closed packed structure. The crystal structure of graphene may have the hexagonal closed packed structure, and the crystal structures of Zn and Ti may have the hexagonal closed packed structure. Accordingly, the first layer GL may be formed on one surface (for example, upper surface) of the second layer ML. The first layer GL containing graphene may be directly formed on one surface of the second layer ML without transferring the first layer GL by performing an additional process.

Typically, a graphene layer is formed using a metal substrate such as Cu, and then, the graphene layer is separated from the metal substrate. Thereafter, the separated graphene layer is transferred to a target member. In an embodiment, the second layer ML containing Zn or Ti and the first layer GL containing graphene may have the same crystal structure of a hexagonal closed packed structure. Accordingly, in such an embodiment, the first layer GL may be formed directly on one surface of the second layer ML.

Figure 6A:
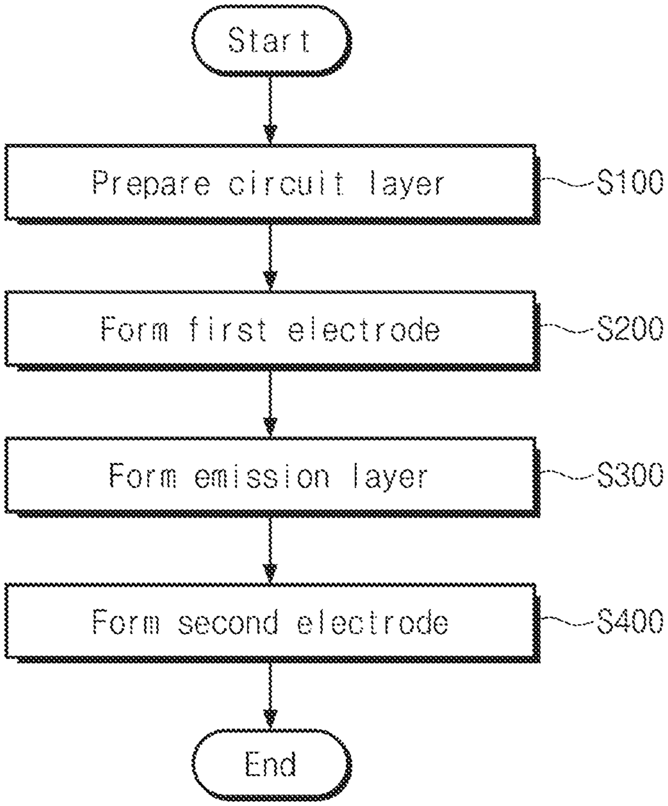
FIG. 6A is a flowchart illustrating a method of manufacturing a display device according to an embodiment.
Figure 6B:
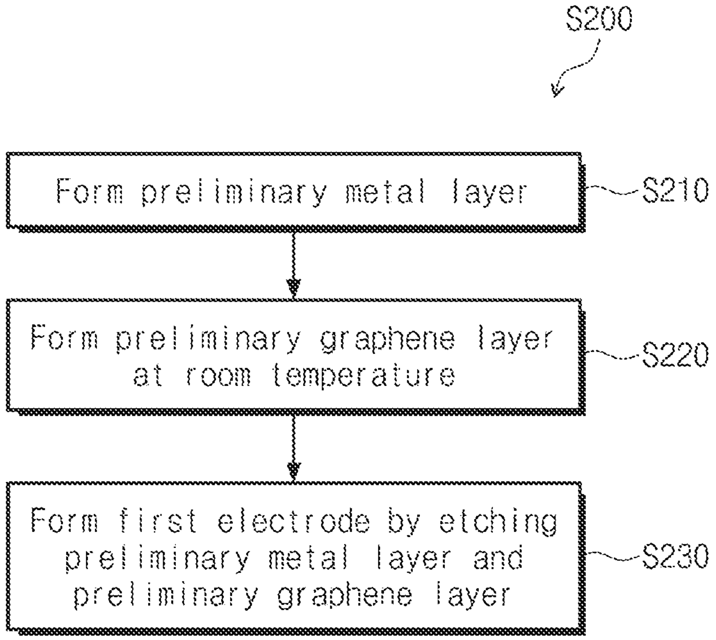
FIG. 6B is a flowchart illustrating a method of manufacturing a display device according to an embodiment.

The display device DD according to an embodiment may be formed through the method of manufacturing the display device according to an embodiment. FIGS. 6A and 6B are flowcharts illustrating a method of manufacturing the display device according to an embodiment. FIGS. 7 to 11 are schematic views illustrating operations of a method of manufacturing the display device according to an embodiment. Hereinafter, in description for a method of manufacturing the display device according to an embodiment with reference to FIGS. 7 to 11, any repetitive detailed description of the same or like elements as those described above the references to FIGS. 1 to 5 will be omitted or simplified, and the following description will be mainly focused on the differences.

Referring to FIG. 6A, the method of manufacturing the display device according to an embodiment may include preparing a circuit layer (S100), forming a first electrode on an upper surface of the circuit layer (S200), forming a light-emitting layer on an upper surface of the first electrode (S300), and forming a second electrode on an upper surface of the light-emitting layer (S400). Referring to FIG. 6B, the forming of the first electrode (S200) according to an embodiment may include forming a preliminary metal layer (S210), forming a preliminary graphene layer on an upper surface of the preliminary metal layer at a room temperature (S220), and forming the first electrode by etching a preliminary first electrode including the preliminary metal layer and the preliminary graphene layer (S230). In this specification, the room temperature means a temperature in a range of about 20° C. to about 30° C.

Figure 7:
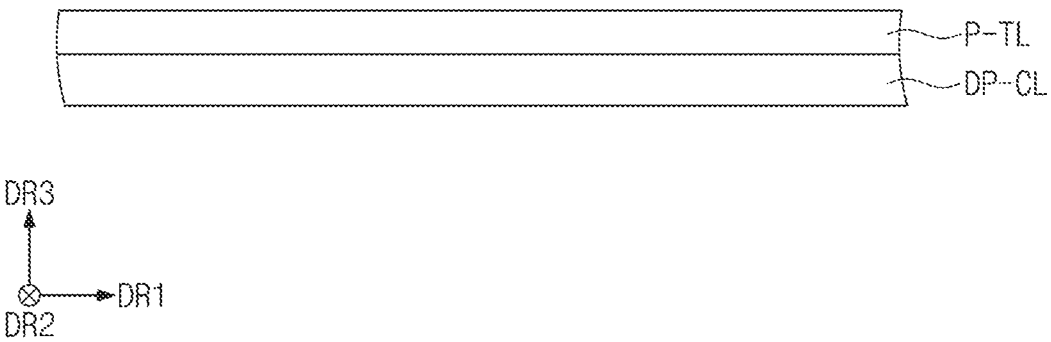
FIG. 7 is a schematic view illustrating operations of a method of manufacturing the display device according to an embodiment.
Figure 8:
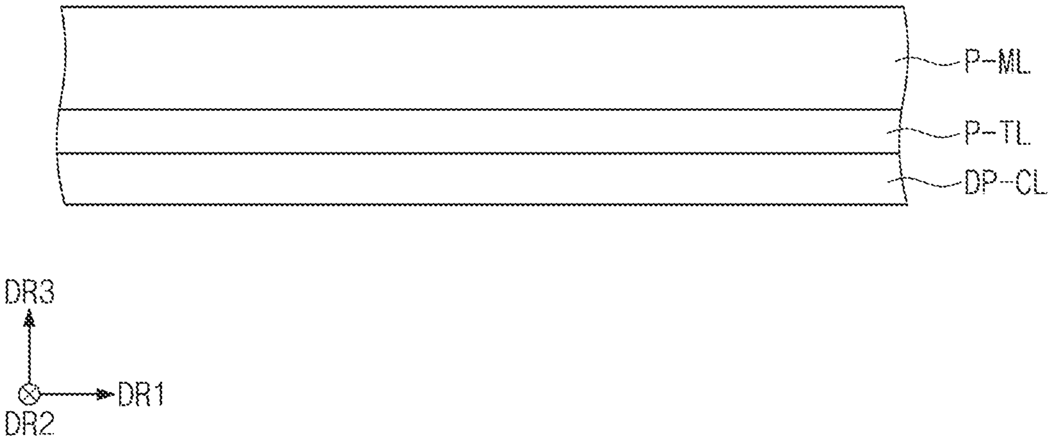
FIG. 8 is a schematic view illustrating an operation of a method of manufacturing the display device according to an embodiment.

Referring to FIGS. 7 and 8, the method of manufacturing the display device according to an embodiment may further include, before the forming of a preliminary metal layer P-ML, forming a preliminary metal oxide layer P-TL on the circuit layer DP-CL. The forming of the first electrode EL1 may further include forming the preliminary metal oxide layer P-TL.

The preliminary metal oxide layer P-TL may include a transparent conductive oxide. The preliminary metal oxide layer P-TL may include at least one selected from indium oxide (ITO), indium zinc oxide (IZO), indium gallium zinc oxide (IGZO), and zinc indium oxide (ZIO). The metal oxide layer TL (see FIG. 5) may be formed from (e.g., by patterning) the preliminary metal oxide layer P-TL. The metal oxide layer TL may be in contact with the insulating layer IL6 (see FIGS. 4 and 5) of the circuit layer DP-CL. The metal oxide layer TL including the transparent conductive oxide may exhibit high bonding strength with the sixth insulating layer IL6. An upper surface of the circuit layer DP-CL illustrated in FIGS. 7 to 11 may be an upper surface of the sixth insulating layer IL6 illustrated in FIGS. 4 and 5.

Figure 9:
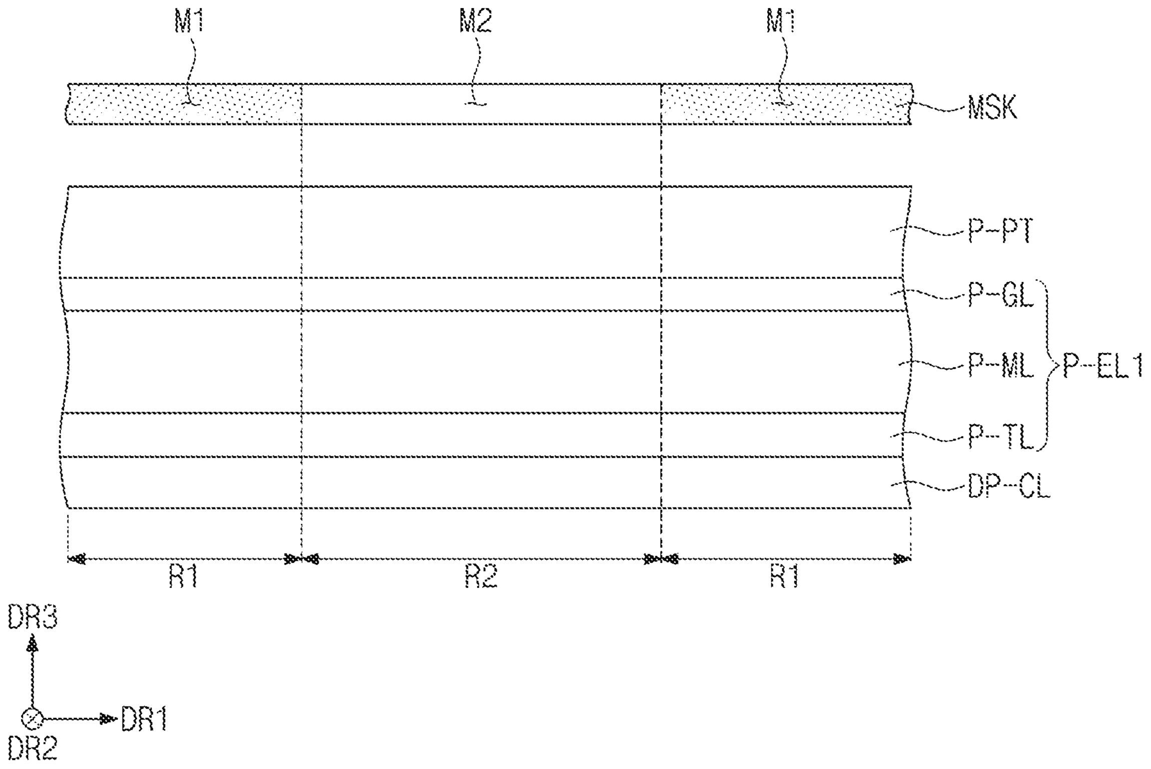
FIG. 9 is a schematic view illustrating an operation of a method of manufacturing the display device according to an embodiment.

Referring to FIGS. 8 and 9, the preliminary metal layer P-ML may be formed on an upper surface of the preliminary metal oxide layer P-TL. A preliminary graphene layer P-GL may be formed on an upper surface of the preliminary metal layer P-ML.

The preliminary metal layer P-ML and the preliminary graphene layer P-GL may have a same crystal structure as each other. In an embodiment, the preliminary metal layer P-ML and the preliminary graphene layer P-GL may each have a hexagonal closed packed structure. In such an embodiment, since the preliminary metal layer P-ML and the preliminary graphene layer P-GL have the same crystal structure as each other, the preliminary graphene layer P-GL may be formed directly on the upper surface of the preliminary metal layer P-ML, and the forming of the preliminary graphene layer P-GL may be performed at a room temperature. The method of manufacturing the device according to an embodiment does not include transferring the preliminary graphene layer P-GL.

Typically, a preliminary graphene layer is formed on one surface of a metal substrate such as Cu, and then, the formed preliminary graphene layer is separated from the metal substrate. Thereafter, the preliminary separated graphene layer is transferred to a target member. The preliminary graphene layer is formed at a high temperature of about 100° C. or greater.

As described above, in the method of manufacturing the display device according to an embodiment, the preliminary graphene layer P-GL is formed directly on one surface (for example, the upper surface) of the preliminary metal layer P-ML, and a transfer process is not performed. Since the preliminary metal layer P-ML has the same crystal structure as that of the preliminary graphene layer P-GL (for example, hexagonal closed packed structure), the preliminary graphene layer P-GL may be directly formed on one surface of the preliminary metal layer P-ML at a room temperature. Accordingly, the method of manufacturing the device may exhibit high manufacturing efficiency.

The preliminary metal layer P-ML may be formed of a single metal. The preliminary metal layer P-ML may include Zn or Ti (e.g., one selected from Zn and Ti. In an embodiment, for example, the preliminary metal layer P-ML may include Zn. In such an embodiment, a crystal structure of Zn, which is included the preliminary metal layer P-ML, may be a hexagonal closed packed structure.

The preliminary graphene layer P-GL may be formed through a plasma enhanced chemical vapor deposition (PECVD) method. A carbon-containing gas may be provided to form the preliminary graphene layer P-GL. In an embodiment, for example, $CH_4$ gas may be provided to form the preliminary graphene layer P-GL. However, a material provided to form the preliminary graphene layer P-GL is not limited thereto, and materials which have been known as being provided to form graphene in the relevant art may be used in the method of manufacturing the device according to an embodiment.

FIG. 9 illustrates providing a photoresist film P-PT on a front surface of the preliminary first electrode P-EL1. The preliminary first electrode P-EL1 may include the preliminary metal layer P-ML and the preliminary graphene layer P-GL. The preliminary first electrode P-EL1 may further include the preliminary metal oxide layer P-TL.

The photoresist film P-PT may be exposed through a mask MSK. The mask MSK may have a first portion M1 where the radiated light is fully blocked and a second portion M2 where the light is partially transmitted and partially blocked. The preliminary first electrode P-EL1 may be divided into a first region R1 corresponding to the first portion M1 and a second region R2 corresponding to the second portion M2.

Figure 10:
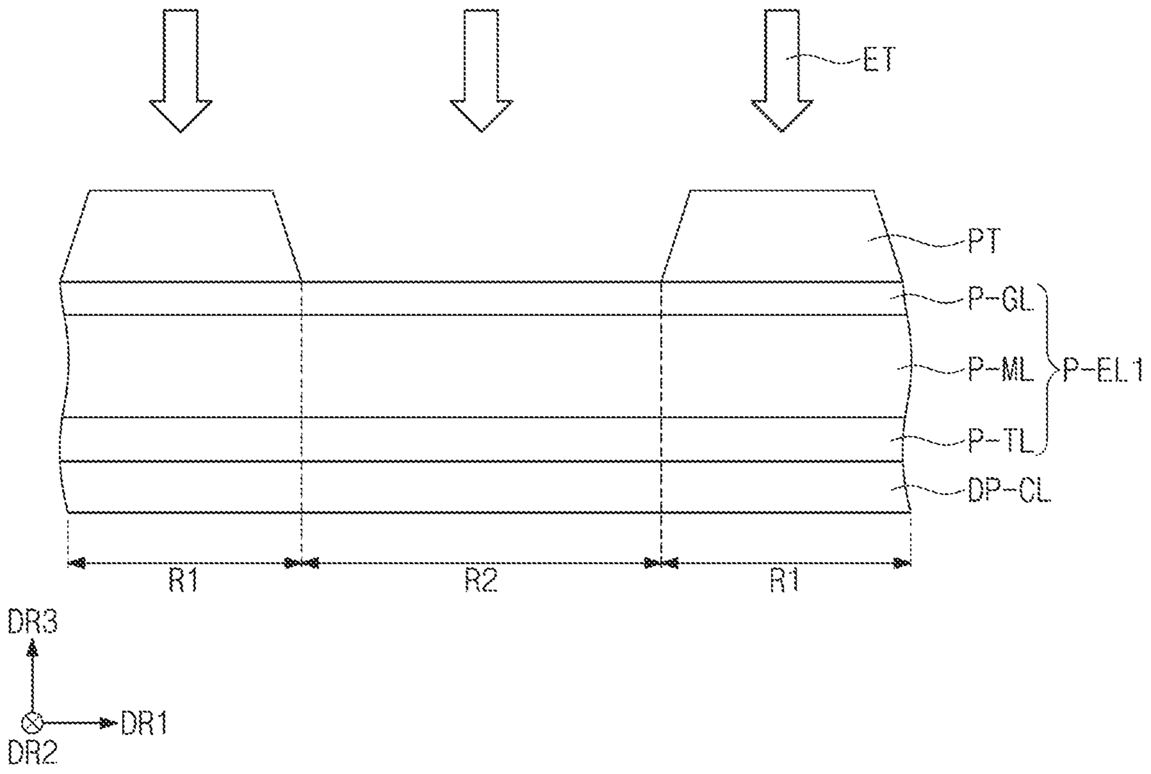
FIG. 10 is a schematic view illustrating an operation of a method of manufacturing the display device according to an embodiment.

Subsequently, as illustrated in FIG. 10, after the photoresist film P-PT exposed through the mask MSK is developed, a photoresist film pattern PT having a predetermined thickness remains in the first region R1 where the light is blocked by the mask MSK and is thus not provided. The photoresist film P-PT is completely removed and the surface of the P-EL1 is exposed in the second region R2 where the light is transmitted and provided through the second portion M2 of the mask MSK. FIGS. 9 and 10 illustrate an embodiment in which a positive photoresist is used such that a photoresist film in the exposed portion is removed, but an embodiment is not limited thereto. In an alternative embodiment, a negative photoresist in which a photoresist film in the unexposed portion is removed may be used.

The photoresist film pattern PT may be used as a mask layer for etching the preliminary first electrode P-EL1. The preliminary first electrode P-EL1 may be wet-etched with an etchant ET. The preliminary graphene layer P-GL, the preliminary metal layer P-ML, and the preliminary metal oxide layer P-TL included in the preliminary first electrode P-EL1 may be substantially simultaneously etched in a same operation or process. The preliminary metal layer P-ML including Zn and the preliminary metal oxide layer P-TL including a transparent conductive oxide may be etched in the same operation or process. Accordingly, the method of manufacturing the device may exhibit high manufacturing efficiency.

Figure 11:
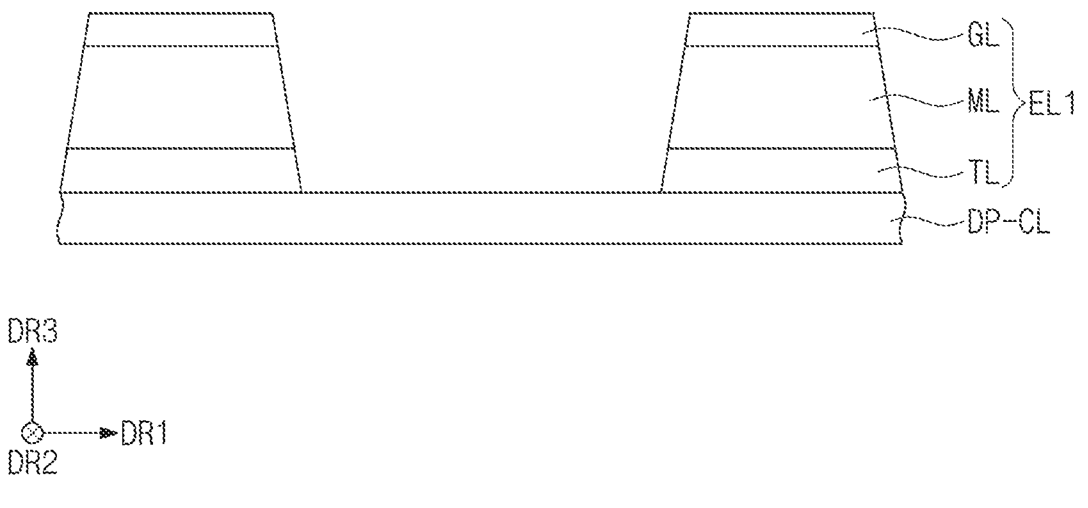
FIG. 11 is a schematic view illustrating an operation of a method of manufacturing the display device according to an embodiment.

As illustrated in FIGS. 10 and 11, the etchant ET may be provided on an upper surface of the preliminary first electrode P-EL1 in which the photoresist film pattern PT is formed. The first electrode EL1 may be formed by etching the preliminary first electrode P-EL1 with the provided etchant ET. Thereafter, the photoresist film pattern may be removed. Although not illustrated, the method of manufacturing the display device according to an embodiment may further include cleaning the preliminary first electrode P-EL1. In the cleaning of the preliminary first electrode P-EL1, ultrapure water suitable for manufacturing a semiconductor may be used as a cleaning material.

The etchant ET may include at least one selected from phosphoric acid, acetic acid, and nitric acid. In an embodiment, for example, the etchant ET may be a phosphoric acid-acetic acid-nitric acid (PAN)-based solution. The preliminary metal layer P-ML including Zn may be easily wet-etched with a phosphoric acid-acetic acid-nitric acid (PAN)-based etchant ET.

The photoresist film pattern PT is formed in the first region R1 of the preliminary first electrode P-EL1, so that the preliminary first electrode P-EL1 may not be etched with the etchant ET. The photoresist film pattern PT is not formed in the second region R2 of the preliminary first electrode P-EL1, and the surface of the preliminary first electrode P-EL1 is exposed so that the preliminary first electrode P-EL1 may be etched with the etchant ET. Accordingly, the first electrode EL1 may be formed from the preliminary first electrode P-EL1. The metal layer ML may be formed from the preliminary metal layer P-ML, the graphene layer GL may be formed from the preliminary graphene layer P-GL, and the metal oxide layer TL may be formed from the preliminary metal oxide layer P-TL.

The method of manufacturing the display device according to an embodiment may include forming a first electrode on an upper surface of the circuit layer. The forming of the first electrode may include forming a preliminary metal layer, forming a preliminary graphene layer on an upper surface of the preliminary metal layer at a room temperature, and forming the first electrode by etching a preliminary first electrode including the preliminary metal layer and the preliminary graphene layer. In such an embodiment, since the preliminary metal layer and the preliminary graphene layer have a same crystal structure as each other, the preliminary graphene layer may be formed at a room temperature. In an embodiment, the preliminary metal layer and the preliminary graphene layer may each have a hexagonal closed packed structure. Accordingly, the method of manufacturing the device may exhibit high manufacturing efficiency.

The display device according to an embodiment may formed through the method of manufacturing the display device according to an embodiment. The display device according to an embodiment may include a circuit layer and a display element layer disposed on an upper surface of the circuit layer. The display element layer may include a pixel-defining film and a light-emitting element. The light-emitting element may include a first electrode, a second electrode disposed opposite to the first electrode, and a light-emitting layer disposed between the first electrode and the second electrode. The first electrode may be exposed through a pixel opening defined in the pixel-defining film. The first electrode may include a metal layer, and a graphene layer disposed on an upper surface of the metal layer, and the metal layer and the graphene layer may each have a hexagonal closed packed structure. In such an embodiment, the light-emitting element may further include a metal oxide layer including a transparent conductive oxide. In such an embodiment, the metal oxide layer including the transparent conductive oxide may exhibit high bonding strength to an insulating layer. In such an embodiment, the light-emitting element including the graphene layer may allow light loss caused by total reflection to be alleviated. Accordingly, the display device including the light-emitting element according to an embodiment may exhibit high luminous efficiency.

A display device according to an embodiment includes a first electrode including a graphene layer, such that high luminous efficiency may be exhibited.

A method of manufacturing the display device according to an embodiment includes forming a graphene layer at a room temperature such that manufacturing efficiency may be improved.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:

a circuit layer; and a display element layer disposed on an upper surface of the circuit layer, wherein the display element layer includes a light-emitting element, and a pixel-defining film, through which a pixel opening is defined, wherein the light-emitting element includes a first electrode exposed through the pixel opening, a second electrode disposed opposite to the first electrode, and a light-emitting layer disposed between the first electrode and the second electrode, the first electrode includes a metal layer, and a graphene layer disposed on an upper surface of the metal layer, the graphene layer is a layer including graphene, and the metal layer and the graphene layer have the same crystal structure of a hexagonal closed packed structure.

2. The display device of claim 1, wherein the metal layer comprises Zn or Ti.

3. The display device of claim 1, wherein the metal layer comprises a single metal.

4. The display device of claim 1, wherein the metal layer has a thickness of about 500 Å or greater.

5. The display device of claim 1, wherein the first electrode further comprises a metal oxide layer disposed below the metal layer, wherein the metal oxide layer comprises a transparent conductive oxide.

6. The display device of claim 5, wherein the transparent conductive oxide comprises at least one selected from indium oxide (ITO), indium zinc oxide (IZO), indium gallium zinc oxide (IGZO), and zinc indium oxide (ZIO).

7. The display device of claim 5, wherein the metal oxide layer is thinner than the metal layer and thicker than the graphene layer.

8. The display device of claim 1, wherein the circuit layer comprises a transistor and an insulating layer disposed on an upper surface of the transistor, wherein the insulating layer is a planarization layer and is in contact with the first electrode.

9. The display device of claim 8, wherein the insulating layer comprises at least one selected from photoresist polyimide (PSPI), siloxane, and an acrylic resin.

10. A display device comprising:

a circuit layer; and a display element layer disposed on an upper surface of the circuit layer, wherein the display element layer includes a light-emitting element, and a pixel-defining film, through which a pixel opening is defined, wherein the light-emitting element includes a first electrode exposed through the pixel opening, a second electrode disposed opposite to the first electrode, and a light-emitting layer disposed between the first electrode and the second electrode, and wherein the first electrode includes:

a first layer including graphene;

a second layer disposed below the first layer and including Zn or Ti; and a third layer disposed below the second layer and including a transparent conductive oxide, and wherein the first layer and the second layer have the same crystal structure.

11. The display device of claim 10, wherein each of the first layer and the second layer have the same crystal structure of a hexagonal closed packed structure.

12. The display device of claim 10, wherein the transparent conductive oxide comprises at least one selected from indium oxide (ITO), indium zinc oxide (IZO), indium gallium zinc oxide (IGZO), and zinc indium oxide (ZIO).

13. The display device of claim 1, wherein the display device is a mobile phone, a tablet personal computer (PC), a vehicle navigation unit, a game console, or a wearable device.

* * * * *